United States Patent [19]

Ohara et al.

[11] Patent Number: 5,268,353
[45] Date of Patent: Dec. 7, 1993

[54] METHOD FOR SEPARATING SUPERCONDUCTOR POWDER FROM NONSUPERCONDUCTIVE POWDER

[75] Inventors: Akinori Ohara; Shunji Yamamoto; Tadatoshi Yamada, all of Amagasaki, Japan

[73] Assignee: Mitsubishi Denki Kabushiki Kaisha, Tokyo, Japan

[21] Appl. No.: 315,788

[22] PCT Filed: Jun. 8, 1988

[86] PCT No.: PCT/JP88/00549

§ 371 Date: Feb. 28, 1989

§ 102(e) Date: Feb. 28, 1989

[87] PCT Pub. No.: WO88/09768

PCT Pub. Date: Dec. 15, 1988

[30] Foreign Application Priority Data

Jun. 9, 1987 [JP] Japan ................. 62-144401
Aug. 18, 1987 [JP] Japan ................. 62-205524
Sep. 3, 1987 [JP] Japan ................. 62-221713

[51] Int. Cl.$^5$ .......................... H01L 39/12; B03B 1/00
[52] U.S. Cl. .......................... 505/1; 209/2; 209/11; 209/212; 505/932
[58] Field of Search ................. 264/24; 505/931, 932, 505/933, 727, 1; 209/212, 225, 232, 2, 11

[56] References Cited

U.S. PATENT DOCUMENTS 4,743,364  5/1988  Kyrazis ................. 209/212
4,828,685  5/1989  Stephens ................. 209/11

FOREIGN PATENT DOCUMENTS 0300353  1/1989  European Pat. Off. .
0320083  6/1989  European Pat. Off. .
45720  3/1969  Japan ................. 505/931
63-252553  10/1988  Japan .
63-278568  11/1988  Japan .
1-30659  2/1989  Japan .
8808619  11/1988  PCT Int'l Appl. .
865392  9/1976  U.S.S.R. ................. 209/212

OTHER PUBLICATIONS

Hor et al, "Switching Phenomena ... Superconductor", Nature, vol. 326, Apr. 1987, p. 669.
Newhouse, "Applied Superconductivity", Sep. 1965, pp. 6–10.
Barsoum et al, "Use Of the Meissner ... Powders", Applied Physics Letters, vol. 51, No. 23, Dec. 1987, pp. 1954–1956.

Primary Examiner—Jan H. Silbaugh
Assistant Examiner—Christopher A. Fiorilla
Attorney, Agent, or Firm—Leydig, Voit & Mayer

[57] ABSTRACT

An oxide superconductor having good current-carrying characteristics can be manufactured by a method including the steps of mixing and baking a plurality of different kinds of ingredient material at a predetermined proportion and obtaining a mixed powder having oxide superconducting powder as a main ingredient, and the step of placing a magnet close to the mixed powder to separate the oxide superconducting powder through the utilization of the magnetic repulsive force due to the Meissner effect of the superconductor. In preferred embodiments, the separating step is carried out in a buoyancy medium and a filter is employed for unifying the particle size of the oxide superconductive powder within a predetermined range.

1 Claim, 6 Drawing Sheets

METHOD FOR SEPARATING SUPERCONDUCTOR POWDER FROM NONSUPERCONDUCTIVE POWDER

TECHNICAL FIELD

This invention relates to a method for manufacturing an oxide superconductor and more particularly to a novel method for separating superconductor powder.

BACKGROUND ART

FIG. 1 is an explanatory view showing the conventional method for manufacturing an oxide superconductor disclosed for example in a paper entitled "Manufacture and Evaluation of Ceramics High-Temperature Superconducting Material", Koji Kishidera, Industrial Chemical Engineering, Department of Engineering, Tokyo University published at a symposium entitled "Manufacture and Application of High-Temperature Superconducting Material" on Apr. 6, 1987. As the first step, an oxide of lanthanoid metal and alkaline earth metal and an oxide of copper are weighed (1). The second step is mixing (2) in a mortar, the third step is pre-baking (3) at a temperature of several hundred degrees, the fourth step is crushing and mixing (4), the fifth step is shaping (5) into a desired configuration, and the sixth step is final baking at a temperature from 900° C. to 1100° C.

This method is called the powder mixing method, and one example of the characteristics of the resistance relative to temperature of an oxide superconductor manufactured by this method is illustrated in a characteristic curve 100 in FIG. 2.

In FIG. 2, the axis of abscissa represents temperature and the ordinate represents resistance. The point E is the temperature usually referred to as the onset at which the change in resistance begins to rapidly decrease, and the point F is the temperature usually referred to as the offset at which the resistance disappears.

The change in resistance according to temperature of the oxide superconductor manufactured by the conventional manufacturing method is as shown by the characteristic curve 100, from which it is seen that the temperature difference between the point E of the onset and the point F of the offset is large, making the offset or the temperature at which the resistance disappears low, so that the necessary low temperature becomes even lower and the characteristics of the resulting superconductor are inferior. These considerations pose a problem.

DISCLOSURE OF THE INVENTION

This invention has been made in order to solve the above-discussed problem and has as its object the provision of a method for manufacturing an oxide superconductor which has a high offset temperature and a small temperature difference between the onset and the offset.

The method for manufacturing an oxide superconductor of the present invention comprises the step of mixing and baking a plurality of different kinds of ingredient material at a predetermined proportion and obtaining a mixed powder having an oxide superconducting powder as a main ingredient, and a step of placing a magnet close to said mixed powder to separate said oxide superconducting powder through the utilization of the magnetic repulsive force due to the Meissner effect of the superconductor.

The separating step according to the present invention can remove the ingredients which exhibit no superconductivity out of the mixed powder, so that a high-quality oxide superconductor in which the temperature difference between the onset and the offset is small and the offset temperature is high can be obtained.

BEST MODES FOR CARRYING OUT THE INVENTION

Figure 1:
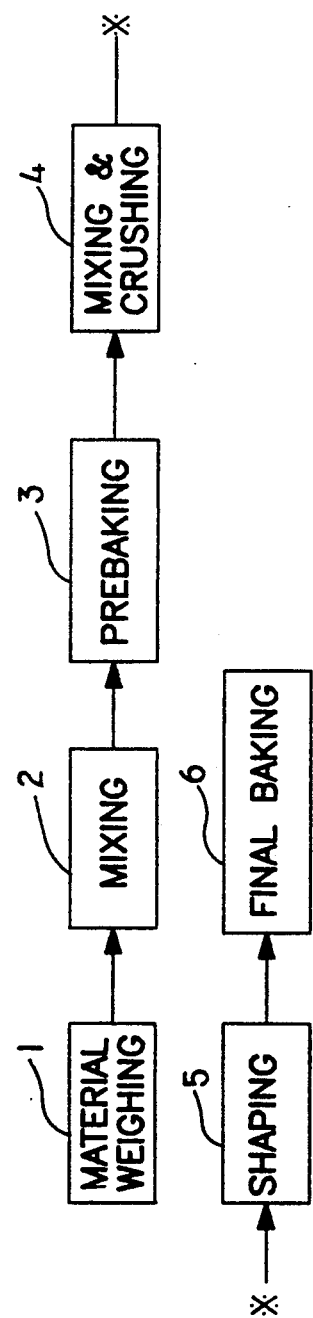
FIG. 1 is an explanatory view showing the conventional method for manufacturing an oxide superconductor.
Figure 3:
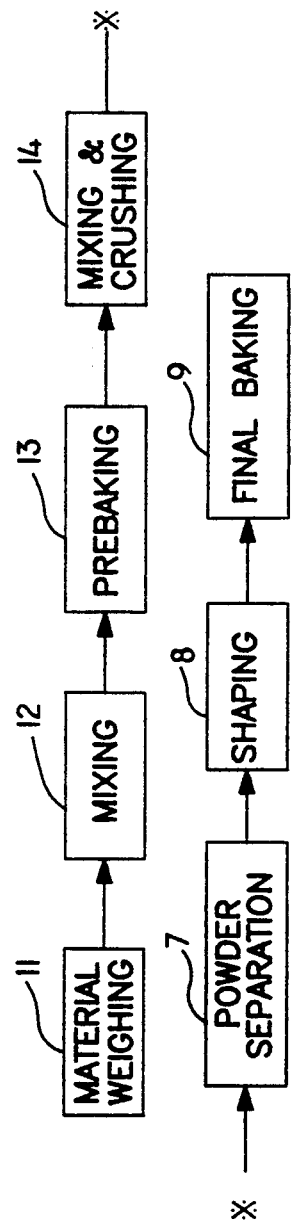
FIG. 3 is an explanatory view showing the method for manufacturing an oxide superconductor according to one embodiment of the present invention.

One embodiment of the present invention will now be described in conjunction with the drawings. FIG. 3 is an explanatory view showing the method for manufacturing the oxide superconductor according to one embodiment of the present invention, in which while the first to fourth steps 11-14 are identical to those (1-4) in the conventional manufacturing method shown in FIG. 1, the fifth step is the separation (7) of the powder, the sixth step is shaping (8) and the seventh step is final baking (9).

Figure 4:
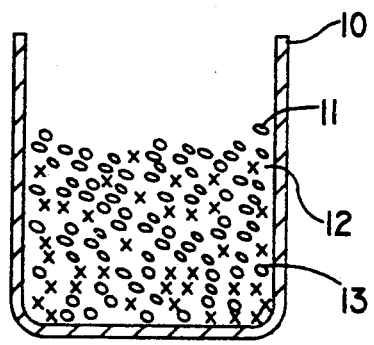
FIG. 4 is a sectional view schematically showing the state of the mixed powder contained in a container.

Then, one embodiment of a concrete method of powder separation will now be described. In FIG. 4, (10) is a container, (11) is oxide superconductor powder, (12) is powder exhibiting no superconductivity, (13) is a mixed powder, and in FIG. 5, (14) is a magnet and (15) are lines of magnetic force produced by the magnet (14).

Figure 5:
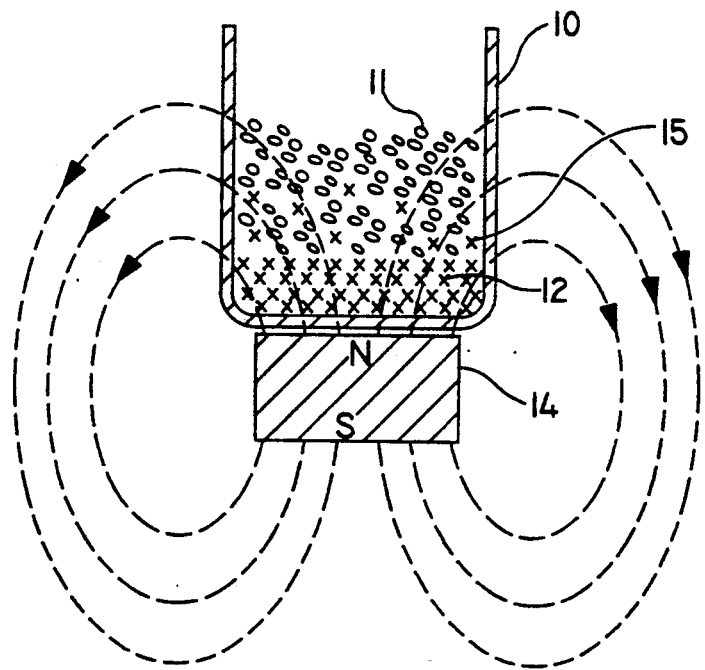
FIG. 5 is a schematic diagram illustrating the separating step in one embodiment of the present invention.

Usually, the mixed powder (13) within the container (10) is a mixture of the powder (11) exhibiting superconductivity and the powder (12) exhibiting no superconductivity as shown in FIG. 4, and the powder advances to the shaping step (8) which is the subsequent manufacturing step according to the conventional method. However, according to the present invention, the magnet (14) is installed at the bottom of the container (10) as shown in FIG. 5, for example. The lines of magnetic force (15) extend around the container (10) as shown in the figure. At this time, when the container (10) is vibrated or its contents are agitated by a suitable rod, the mixed powder (13) is moved and the superconductive powder (11) is moved away from the magnet (14) because it reflects the lines of magnetic force by the magnetic repulsive force due to the diamagnetism action or the Meissner effect. That is, the superconductive powder (11) is collected at the upper portion of the container (10) and the non-superconductive powder (12) collects at the lower portion of the container (10). By thus carrying out the separation and collecting the useful powder (11), the powder is supplied to the next step.

Figure 2:
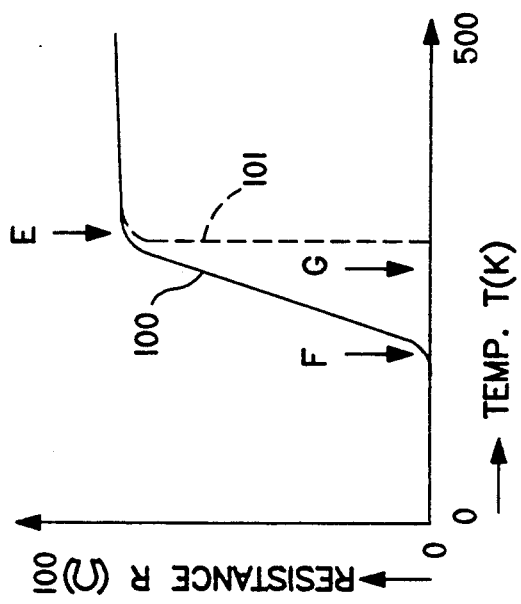
FIG. 2 is a graph showing the resistance-temperature characteristics of the oxide superconductors manufactured by the conventional method and one embodiment of the present invention.

The resistance characteristics against temperature of the oxide superconductor manufactured by the above-described manufacturing method is as shown in a characteristic curve 101 of FIG. 2, wherein the temperature at the offset point G is high and the temperature difference between the onset point E and the offset point G is small.

Figure 6:
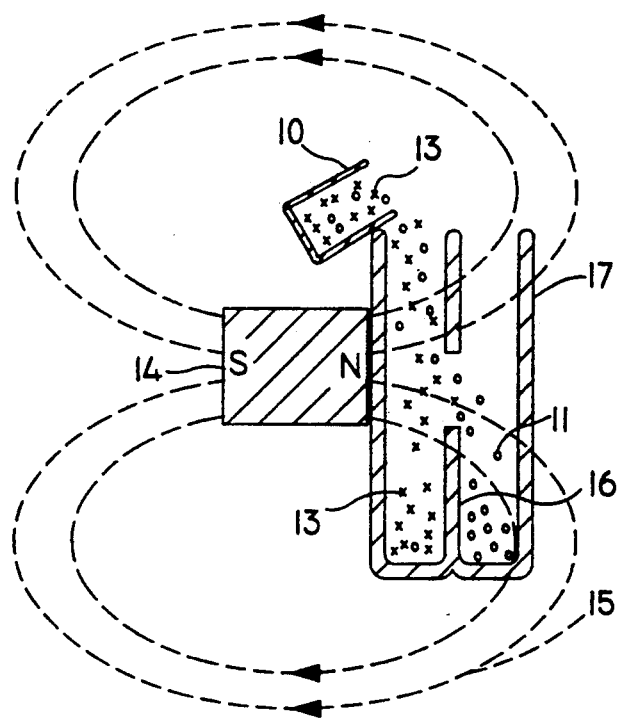
FIGS. 6, 7, 8 and 9 are schematic diagrams illustrating the separating steps in other different embodiments.

FIG. 6 illustrates an embodiment in which the magnet (14) is disposed on one side of a separating container (17) having a central partition (16) inserted therein and in which the mixed powder (13) is dropped from above the separating container (17). At this time, the superconducting powder (11) moves away from the magnet (14) to fall on the remote side of the partition (16) of the separating container (17). On the other hand, the powder (12) which exhibits no superconductivity freely falls, so that the separation can be carried out.

The separation of the powder is carried out by cooling the oxide superconductive powder to a temperature at which it exhibits superconductivity.

According to each embodiment as above described, the method comprises the step of mixing and baking a plurality of different kinds of ingredient material at a predetermined proportion and obtaining a mixed powder having an oxide superconducting powder as a main ingredient, and the step of placing a magnet close to said mixed powder to separate said oxide superconducting powder through the utilization of the magnetic repulsive force due to the Meissner effect of the superconductor, so that a high-quality oxide superconductor in which the temperature difference between the onset and the offset is small and the offset temperature is high can be obtained.

Figure 7:
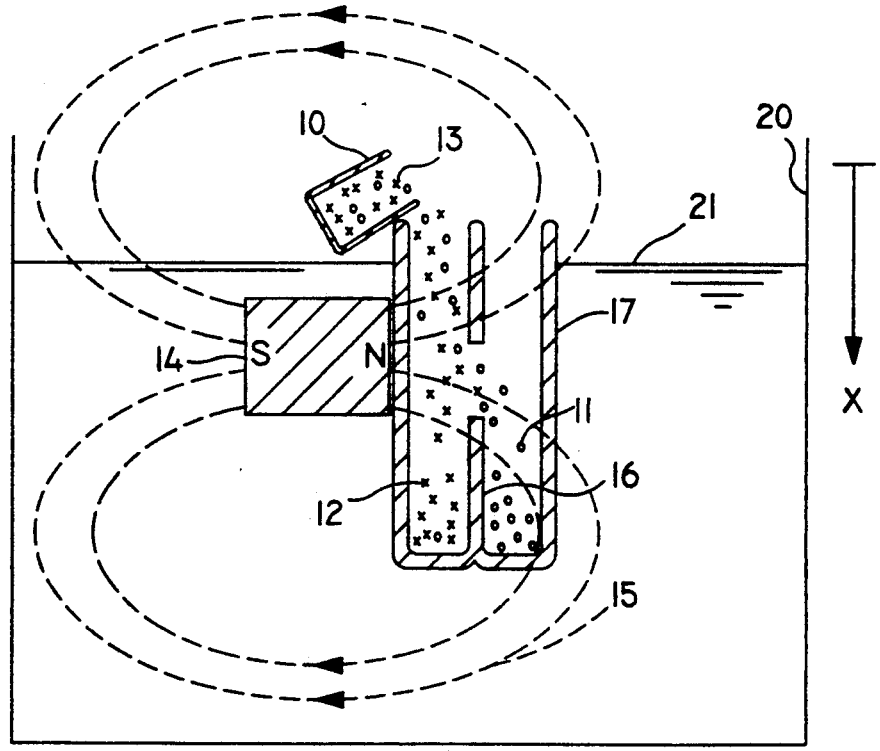

Another embodiment concerning the separating step of the present invention will now be described. The description will be made only in terms of the separating step since the method for manufacturing an oxide superconductor of this embodiment is the same as the conventional method except for the separating step. In FIG. 7, (20) is a container for containing a buoyancy medium (21) such as liquid nitrogen, and x is the falling distance of the powder falling from the container (10) at an initial speed of 0.

The mixed powder (13) within the container (10), which has mixed therein the oxide superconducting powder (11) and the impurity (12) which exhibit no superconductivity, has a particle size usually ranging from 1 μm to 1 mm. If the particle size is too large, it is possible that both the oxide superconducting powder (11) and the impurity (12) are included in a single particle or grain, so that the particle size must be made relatively small to a certain extent.

The process of the separation and the collection of the mixed powder (13) is basically identical to that of the embodiment shown in FIG. 6, so that its explanation will be omitted. What is greatly different from the conventional method is the improvements in the separation and collection effects by buoyancy, which will now be described below.

The density of Y-Ba-Cu-O which is a typical example of the oxide superconductor (11) is normally in the order of about $5 \pm 1$ kg/l at 1 atmospheric pressure. The density of the liquid nitrogen (21) is 0.8 kg/l. The falling distance x for the mixed powder (13) falling by the magnet (14) due to the gravity acceleration $g = 9.8$ m/sec$^2$, when the initial speed of the powder is 0 m/sec and there is no liquid nitrogen and therefore no buoyancy, is expressed by the following equation:

$$x = (\tfrac{1}{2}) g t^2 \tag{1}$$

where, t is the time after the powder has started to fall. From equation (1), the falling distance x of the powder after 0.2 sec is $x = 0.2$ m. However, when the buoyancy from the liquid nitrogen (21) acts, the falling speed is decreased by $0.8/5 = 0.16$ which is the density ratio between the mixed powder (13) and the liquid nitrogen (21). That is, the falling distance x for the powder after 0.2 sec is only $x = 0.168$ m. This means that the mixed powder (13) slowly passes by the magnet (14) and the time period during which the superconductive powder (11) is subjected to the Meissner effect from the magnet (14) is extended, enabling a very strict separation and collection of the powder. It is possible to separate and collect the superconducting powder (11) of a very high purity containing almost no impurities (12) by the above-described process, and it was found that the shaped and finally baked superconducting powder thus collected exhibits the superconducting characteristic as shown by a characteristic curve 103 in FIG. 10 from which it is seen that the current carrying characteristics is significantly improved.

Figure 8:
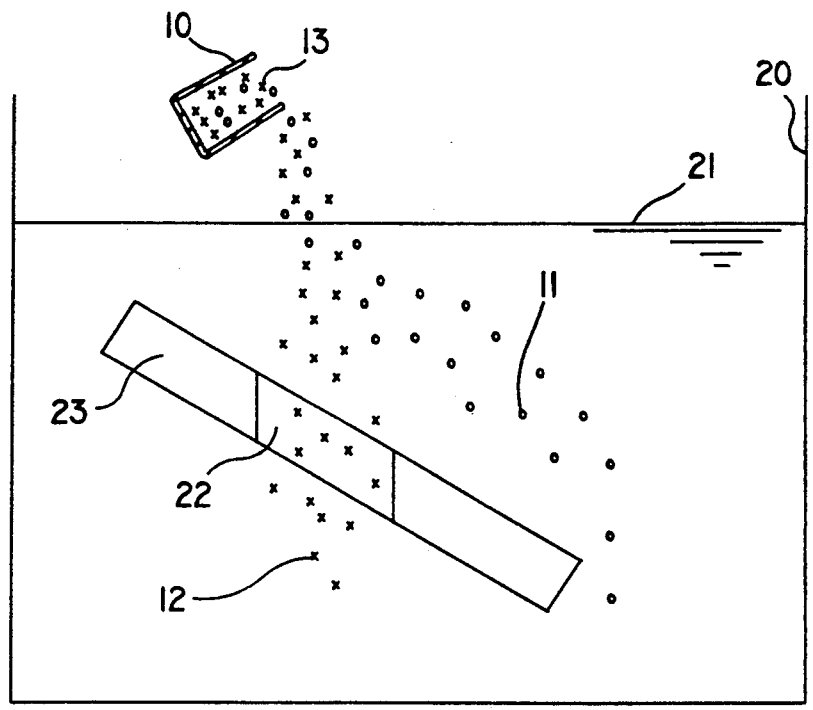

FIG. 8 is a sectional view for explaning the separating step of a still another embodiment, in which the arrangement is such that a magnet (23) having a through hole (22) at its center is installed in a slanted position in the buoyancy medium (21), the impurity (12) falls downward through the through hole (22), and the falling path of the oxide superconductor (11) is bent right-downwardly in the figure by the repulsion against the magnet (23) by the Meissner effect.

The buoyancy medium (21) may be liquid oxygen, liquid air, etc. in addition to liquid nitrogen used in the above embodiments, these media also serving as a cooling medium .for cooling the oxide superconducting powder (11) to be separated below the critical temperature.

Further, while the separated oxide superconducting powder (11) is shaped (8) and finally baked (9) in the above embodiments, it may also be used in the powder state.

Figure 10:
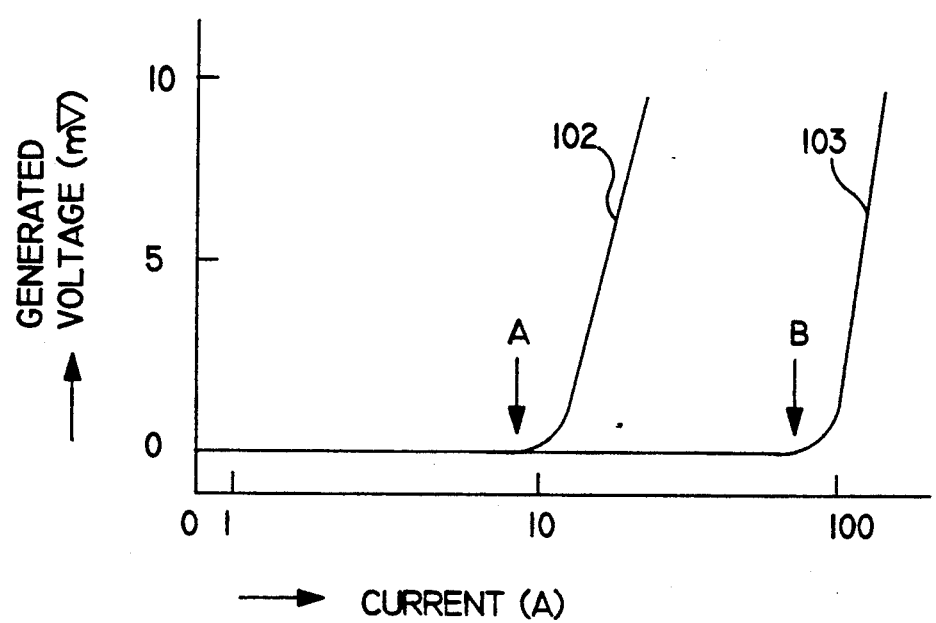
FIG. 10 is a characteristic diagram showing the current carrying characteristic of the oxide superconductor obtained by the embodiments and shown in FIGS. 7, 8 and 9.

As has been described, according to the embodiment shown in FIGS. 7 and 8, in the method which comprises the step of mixing and baking a plurality of different kinds of ingredient material at a predetermined proportion and obtaining a mixed powder having oxide superconducting powder as a main ingredient, and the step of placing a magnet close to said mixed powder to separate said oxide superconducting powder through the utilization of the magnetic repulsive force due to the Meissner effect of the superconductor, said separating step is carried out in a buoyancy medium, so that the separation accuracy is increased and an oxide superconductor having a current-carrying characteristic as shown by a curve II in FIG. 10 which is superior to the oxide superconductor obtained by the method shown in FIG. 6 can be obtained.

Figure 9:
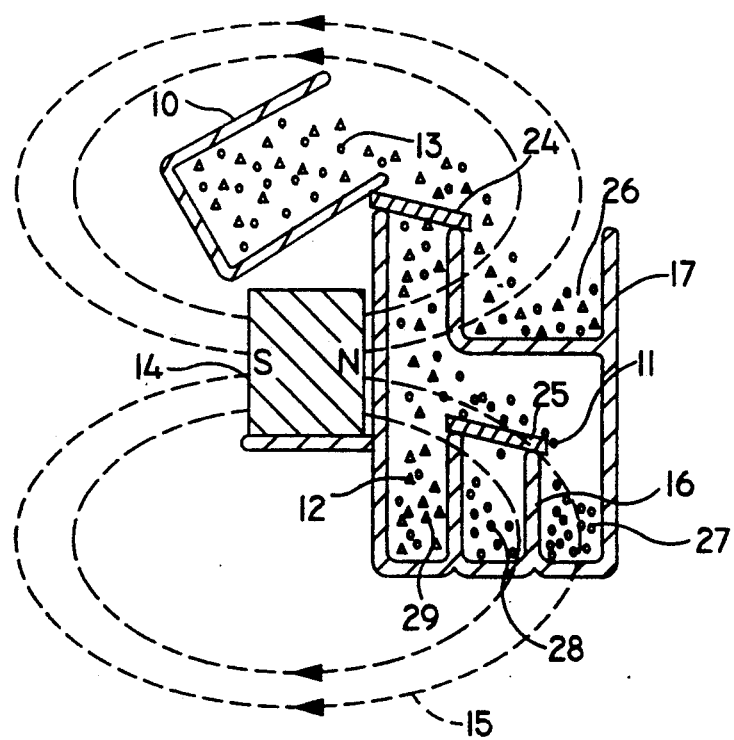

Another embodiment in terms of the separation step will now be described in conjunction with FIG. 9. FIG. 9 is a schematic sectional view for explaining one part of the method for manufacturing an oxide superconductor according to this embodiment, wherein (24) is a first sieve or filter having a mesh size of 100 μm, (25) is a second sieve or filter having a mesh size of 1 μm, (26) is a first chamber, (27) is a second chamber, (28) is a third chamber and (29) is a forth chamber.

The mixed powder (13) within the container (10), which has mixed therein the superconducting powder (11) which is a component exhibiting superconductivity and the impurity powder (12) which is a component exhibiting no superconductivity, has a particle size usually ranging from less than 0.1 $\mu$m to about 1 mm. In the separation container (17), the mixed powder (13) is separated into the powder having a particle size of equal to or more than 100 $\mu$m and the powder having a particle size of equal to or less than 100 $\mu$m by the first filter (24) of 100 $\mu$m mesh. That is, the powder of equal to or more than 100 $\mu$m particle size does not pass through the first filter (24) and fall into the first chamber C (26), and the powder of equal to or less than 100 $\mu$m particle size falls through the first filter (24). During falling, by the action of the lines (15) of magnetic force from the magnet (14) as well as the Meissner effect of the superconductor, only the powder (11) which is the component exhibiting the superconductivity is pushed to the right in the figure and falls onto the second filter (25). Since the second filter (25) has the mesh size of 1 $\mu$m, the powder of a particle size less than 1 $\mu$m falls into the third chamber (28) and the powder of a particle size equal to or more than 1 $\mu$m falls into the second chamber (27), then they are collected and advanced to the next shaping and baking steps. Since the oxide superconductor is manufactured with the powder of uniform particle size, the oxide superconductor having a dense system can be obtained.

One of the factors for increasing the critical current density and the critical magnetic field of the superconducting wire is the magnitude of the pinning force, which pinning force depends on the mean particle size of the oxide superconductor and is generally selected to be equal to or greater than 1 $\mu$m as described in a paper ("Superconducting Magnet Research Center Report" Vol. 3, P.34–P.38, December, 1986, published from Superconductive Magnet Research Center attached to Department of Engineering, Kyushu University). Also, according to the results of the experiments conducted by the inventors of the present invention, the upper limit is 100 $\mu$m, and it was confirmed that, if the particle size is larger than this, the oxide superconductor is generally poor and has a very wide temperature difference between the onset and the offset.

The current-carrying characteristic of the oxide superconductor obtained by the above embodiment is shown by the characteristic curve 103 of FIG. 10. It is seen that the critical current level is at the point B which is significantly higher than the point A in case of the previous embodiment shown in FIG. 6.

As has been described, according to this embodiment, the method comprises a step of mixing and baking a plurality of different kinds of ingredient material at a predetermined proportion and obtaining a mixed powder having oxide superconducting powder as a main ingredient, a step of placing a magnet close to said mixed powder to separate said oxide superconducting powder through the utilization of the magnetic repulsive force due to the Meissner effect of the superconductor, and a step of unifying the particle size of said oxide superconductive powder to be from 1–100 $\mu$m, so that an oxide superconductor having a high critical current value and superior characteristics can be obtained.

This invention can be utilized in manufacturing an oxide superconductor of a high critical current value and improved characteristics.

We claim:

1. A method for manufacturing an oxide superconductor comprising:

mixing and baking a plurality of different kinds of ingredients at a predetermined proportion, thereby obtaining a mixed powder having oxide superconductive powder as a main ingredient and non-superconductive powder as a second ingredient;

dropping the mixed powder downward through a first filter having a predetermined first mesh size into a container and cooling the mixed powder below a temperature at which the oxide superconductive powder is superconductive as the mixed powder of a grain size below the predetermined first mesh size of the first filter falls vertically in a first vertical path;

applying lines of magnetic force to the mixed powder that produce a magnetic repulsive force due to the Meissner effect which diverts the oxide superconductive powder from the first vertical path into a second path which is inclined relative to the first vertical path, thereby causing the oxide superconductive powder below the predetermined first mesh size to be separated in the container from the non-superconductive powder;

separating the superconductive powder of a grain size less than said predetermined first mesh size; and separating the oxide superconductive powder having a grain less than the predetermined first mesh size according to size by dropping the oxide superconductive powder downward through a second filter having a predetermined second mesh size, thereby diverting a portion of the oxide superconductive powder having a grain size greater than the second predetermined mesh size into a third path in the container.

* * * * *